United States Patent [19]

Hoshi

[11] Patent Number: 4,823,907

[45] Date of Patent: Apr. 25, 1989

[54] BALLOON ASSEMBLY

[76] Inventor: Hatsuo Hoshi, No. 13-19, Shikiji 2-chome, Shizuoka-shi, Shizuoka-ken, Japan

[21] Appl. No.: 51,321

[22] Filed: May 19, 1987

[30] Foreign Application Priority Data

Nov. 19, 1986 [JP] Japan ................................ 61-275885

[51] Int. Cl.[4] .......................... H04R 7/00; H05K 5/00

[52] U.S. Cl. .................................... 181/148; 181/141; 181/150; 181/161; 181/172; 181/173; 381/152; 381/153; 381/202; 381/205

[58] Field of Search ............... 181/148, 153, 161, 165, 181/157, 167, 150, 172, 173, 141; 381/152, 153, 156, 202, 205; 128/684-689

[56] References Cited

U.S. PATENT DOCUMENTS

| | | | |
|---|---|---|---|
| 1,730,532 | 10/1929 | Robbins | 181/153 |
| 2,755,796 | 7/1956 | Boucke | 128/687 |
| 3,315,662 | 4/1967 | Buffington | 128/687 |
| 3,812,301 | 5/1974 | Lahti | 381/156 |
| 4,010,821 | 3/1977 | Quillmann | 181/448 |
| 4,033,337 | 7/1977 | Raczkowski | 128/686 |

FOREIGN PATENT DOCUMENTS

| | | | |
|---|---|---|---|
| 69406 | 11/1958 | France | 181/161 |

*Primary Examiner*—B. R. Fuller

*Attorney, Agent, or Firm*—Wegner & Bretschneider

[57] ABSTRACT

A speaker system includes a thin plate type vibrating element mounted in, and brought into contact with, a balloon formed of a synthetic rubber or resin film. The balloon comprises a balloon member formed of a flexible film such as a vinyl chloride resin or synthetic rubber film and having therein a pocket, in which an inner film forming the pocket has an area somewhat larger than that surrounded with a laminating line on an outer film forming the pocket, whereby the inner film is brought in pressure contact or engagement with the outer film, when the balloon assembly is inflated.

4 Claims, 2 Drawing Sheets

BALLOON ASSEMBLY

BACKGROUND OF THE INVENTION

1. Field of the Invention

The present invention relates to a balloon assembly, and has particular, but not exclusive, reference to a balloon assembly of the type applicable as part of a speaker system.

2. Statement of the Prior Art

As well-known in the art, a speaker comprises a vibrating element such as a horn or vibrating plate and a horn. The vibrating element is used to convert a change in the electrical vibrations given to mechanical vibrations, while the horn is adapted to amplify the latter vibrations, thereby to increase efficiency and acoustic output.

For the vibrating element, a variety of elements such as those of moving coil type, moving iron type, crystal type and condenser type have been used for the purposes intended. The vibrating element used has been decreased in size and, in recent years, has been constructed from a small thin plate having a diameter of 20 $\phi$ or lower, in particular. The old vibrating element is of a three-dimensional form comprising a vibrator such as a vibrating plate or corn and an oscillator such as an electromagnet or permanent magnet. However, the conventional thin vibrating element has a vibrator which is designed to serve as an oscillator as well, and is of a plane form that apparently comprises a single thin plate. This thin vibrating element may therefore find wider use than the old one does, since it does not virtually require any special space for its attachment. In actual applications, however, this thin vibrating element has only find its use for systems such as telephone speaker systems, where the vibration sound is caught close to an ear with no horn attached. This is because of the absence of any suitable means for sufficiently amplifying the vibrations.

To the old vibrating element comprised of a vibrator and an oscillator, as mentioned above, a horn can be attached, since the vibrator works smoothly even when that element is mounted on a supporting member. When a horn is attached to the thin plate type vibrating element, however, the vibrating element behaves as if it is attached as such to the horn, partly because the vibrator per se thereof serves as the oscillator. Thus, the horn functions only as a supporting member, thus failing to produce an amplifying function. For that reason, there has been demand for the development of methods for amplifying the vibrations of this plate type vibrating element and thereby obtain sufficient acoustic output.

Another disadvantage of the thin plate type vibrating element is that there is no suitable method for attaching it to a balloon in the case that the balloon is applied as part of a speaker system, as disclosed in Japanese Patent Application No. 61-275885 specification.

SUMMARY OF THE INVENTION

A main object of the present invention is to provide a speaker system including a thin plate type vibrating element and a balloon member which is inflated into contact with said element to effect its resonance thereof and increase its acoustic output.

Another object of the present invention is to provide a pocketed balloon assembly adapted to be used with the aforesaid vibrating element in particular, which is formed of a flexible film such as a vinyl chloride resin or synthetic rubber film, and in which an inner film forming a pocket has an area somewhat larger than that surrounded with a laminating line on an outer film forming said pocket, whereby said inner film is brought into pressure contact or engagement with said outer film, when said balloon is inflated. This balloon assembly is applicable to not only speaker systems but also playthings such as beach balls or swimming tires.

BRIEF DESCRIPTION OF THE DRAWINGS

The aforesaid and other objects and features of the present invention will become apparent from the following detailed description with reference to the accompanying drawings, which are given for the purpose of illustration alone, and in which.

PREFERRED EMBODIMENTS OF THE INVENTION

Figure 1:
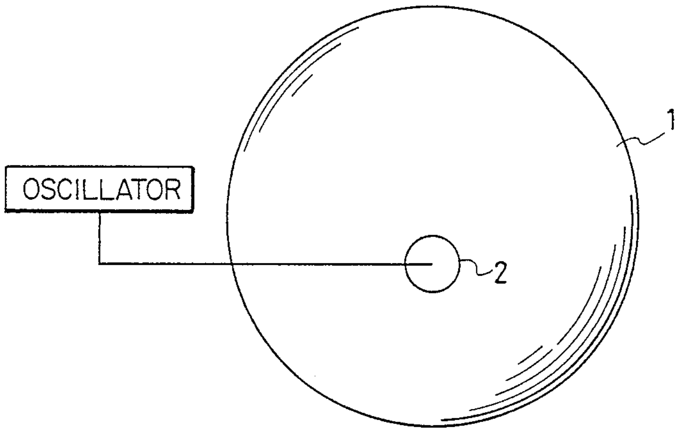
FIG. 1 is a perspective view showing one embodiment of the speaker system according to the present invention.

One preferable embodiment of the speaker system according to the present invention will now be explained in detail with reference to FIGS. 1 and 2 wherein reference numeral 1 stands for a balloon and 2 indicates a thin plate type vibrating element. As is the case with a telephone speaker, for instance, the element 2 vibrates in response to an electrical output sent from an electrical oscillator, and is formed of a ceramic material or the like. The balloon 1 serves as a member for supporting the element 2 and is adapted to resonate with its vibration and thereby increase its acoustic output. The balloon 1 is an airtight bag member formed of a film of synthetic rubber or resin, which is fitted therein with air or other gases for its inflation.

FIG. 1 illustrates one embodiment of the speaker system comprising the balloon 1 formed into a spherical shape, which has the thin plate type vibrating element 1 bonded to a part of the surface thereof.

Figure 2:
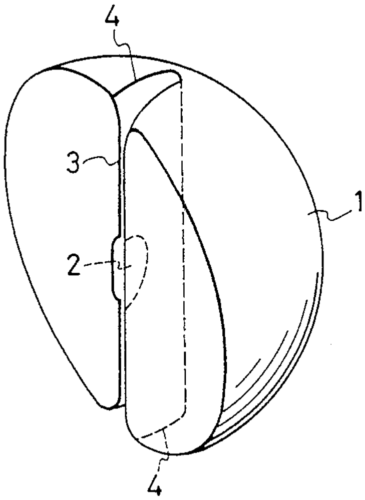
FIG. 2 is a partly cut-away perspective view showing another embodiment of the speaker system according to the present invention.

FIG. 2 illustrates another embodiment of the speaker system comprising the balloon 1 having therein a cylindrical portion 3 in which the thin plate type vibrating element 2 is inserted. In this embodiment, it is essential that the cylindrical portion 3 has at least its upper and lower edges joined to the balloon 1 in order that, when a given amount of a gas is filled in the balloon 1 for its inflation, that portion is brought into a tensioned state and is, at the same time, bent closely on itself as if two films are superposed upon each other by a gas pressure. Thus, the cylindrical portion 3 is made integral with the balloon 1 to form a certain type of resonator. According to this embodiment, the thin plate type vibrating element 2 may only be inserted into the cylindrical portion 3 with no need of being bonded thereto, since it is then fixedly clamped therein.

In the speaker system of the present invention, as detailed above, the balloon is used as an amplifier by attaching thereto the thin plate type vibrating element. That speaker system is of light weight, and can be placed on desks, suspended with a string or flown by filling a light gas in the balloon, since it is of no directivity in respect of shape, unlike the horn of the conventional speaker system. Thus, the speaker system of the present invention is expected to find use in many applications.

Figure 3:
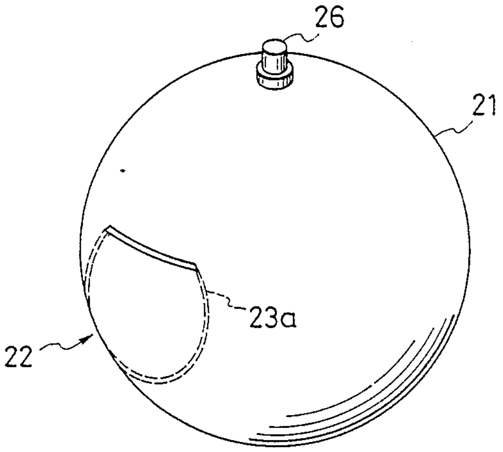
FIG. 3 is a perspective view showing one specific embodiment of the balloon assembly according to the present invention.
Figure 4A:
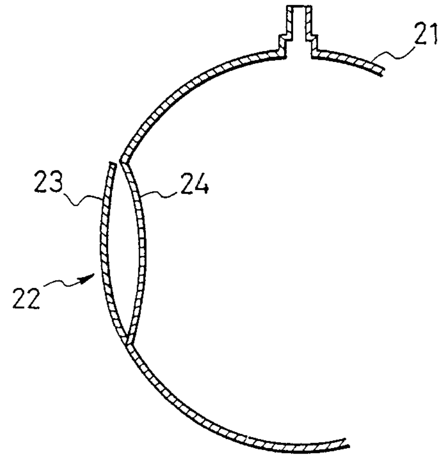
FIGS. 4*a* and 4*b* are a longitudinally sectioned front view of that one embodiment in use.
Figure 4B:
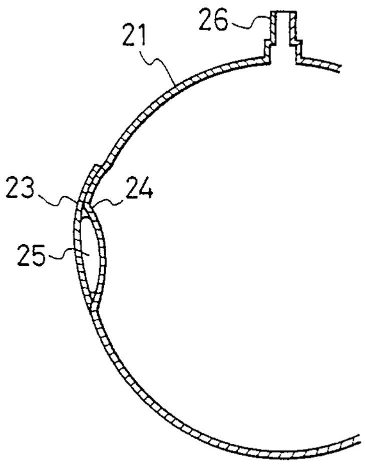

One specific embodiment of the balloon assembly according to the present invention will now be explained with reference to Figures 3, 4*a* nd 4*b* wherein the balloon member and a pocket formed therein are shown at 21 and 22, respectively. The balloon member 21 may be formed of a flexible film such as a vinyl cholride resin film or synthetic rubber film, of which the conventional balloon has been also formed, and into a spherical, spindle-lke, doughnut-like or other suitable shape, depending upon the purpose. The pocket 22 is functionally similar to an ordinary one, and is formed into a bag shape by superposing an outer film 23 upon an inner film 24 and laminating them together except for at least one portion. In particular, the pocket 22 has its inner film 24 made integral with the balloon member 21 to form a part thereof. In addition, the inner film 24 is formed of a film which has an area somewhat larger than that encircled by a laminating line 23*a* and is equal to or larger than the outer film 23, whereby, when the balloon 21 is inflated, the outer film 23 is tensioned in the same manner as the balloon 21 to bring the inner film 24 into pressure contact or engagement with the outer film 23 by the interior pressure of the balloon 21.

Therefore, when the balloon 21 is inflated with the pocket 22 receiving therein an article 25 as represented by the aforesaid thin plate type vibrating element, the article 25 is sandwiched in between the inner and outer films 24 and 23. Moreover, the outer and inner films 23 and 24 are brought into close contact with each other at the portions wherein the article 25 is not found, whereby the article 25 is fixedly urged against the inner face of the outer film 23 and is, at the same time, put into an airtight state. It is to be noted that reference numeral 26 indicates a blow nozzle for blowing or discharging air into or from the balloon 21.

The balloon according to the aforesaid embodiment is formed with the pocket. When the balloon is inflated, the pocket is tensioned and the outer and inner films forming it are brought into pressure contact with each other. The article, e.g., the thin plate type vibrating element, confined in the pocket is fixedly sandwiched in between both films in a sealed state. Therefore, it is very unlikely that such a vibrating element may come out of the pocket, or may be wetted with water.

Figure 5:
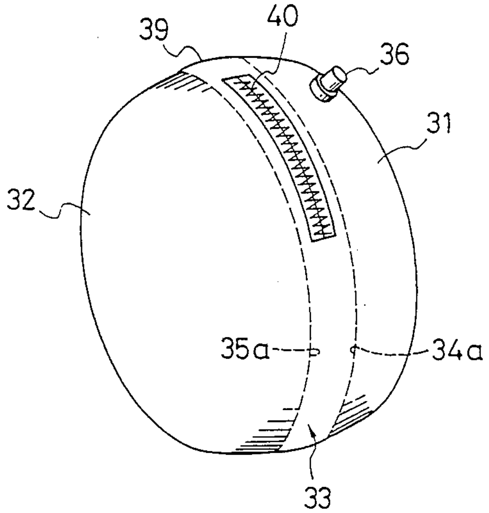
FIG. 5 is a perspective view showing another embodiment of the balloon assembly according to the present invention.
Figure 6:
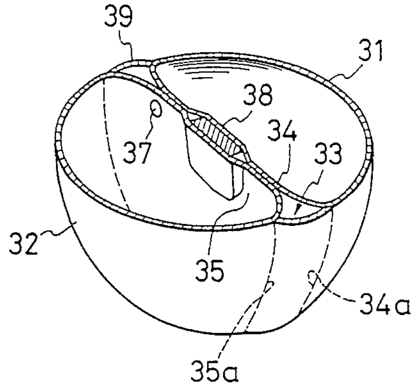
FIG. 6 is a partly cut-away perspective view of that embodiment in use.

FIG. 5 shows another embodiment of the balloon assembly according to the present invention, and FIG. 6 is a partly cut-away view showing the same. According to this embodiment, the outer film 23 of the pocket 22 in the balloon member 21 shown in FIG. 3 is provided with another balloon member. In this embodiment, two balloon members 31 and 32 are symmetrically arranged to form a single balloon which seemingly have therein a pocket 33. The balloon members 31 and 32 are both formed of a flexible film such as a vinyl chloride or synthetic rubber film, and joined together back to back. The pocket 33 is then defined by a portion surrounded with the opposite faces 34 and 35 of both balloon members 31 and 32. That is, the pocket 33 is provided by the opposite faces 34 and 35 which correspond to the outer and inner films 23 and 24 of the pocket 22 shown in FIG. 3.

The aforesaid embodiment is shown to have a gore 39 between both balloon members 31 and 32. It is to be understood, however, that such a gore is not always needed, since it is provided for the purpose of increasing the volume of the pocket 33 and mounting a fastener 40 to an opening in the pocket 33. Laminating lines 34*a* and 35*b* along which the gore 39 is laminated on the edges of the opposite faces 34 and 35 correspond to the laminating line 23*a*, shown in FIG. 3, along which the outer film 23 is laminated on the inner film 24. It is therefore essential that the opposite face 34 be made somewhat larger than a region surrounded with the laminating line 34*a*. In the embodiment illustrated, a blow port 36 is formed in one balloon member 31, and both balloon members 31 and 32 are allowed to communicate with each other through a vent hole 37.

This arrangement assures that the interior pressures of both balloon members 31 and 32 are constantly on the same level so that the portions of engagement of the opposite faces 34 and 35 become flat.

Therefore, when the balloon assembly is inflated with an article, e.g., a thin vibrating plate 38 confined in the pocket, the opposite faces 34 and 35 define flat planes at the substantial middle of the balloon assembly, between which the article 38 is fixed, as illustrated in FIG. 6.

It is understood that the embodiment as mentioned just above may be used as a display by constructing the balloon members of a (semi) transparent film. In addition, since the article is protected against external impacts by the balloon members, that embodiment may be used as a beach ball or the like, while it has therein an easy-to-break unit such as a miniature radio set or TV set.

What is claimed is:

1. An acoustic speaker system, said system comprising:

- a balloon amplifier, said balloon amplifier having a pocket formed therein;
- a thin plate vibrating element disposed within said pocket, so that, when said balloon amplifier is fully inflated, said balloon amplifier contacts both surfaces of said thin plate vibrating element; and
- an electrical oscillator means for sending a signal to said thin plate vibrating element, said signal causing said thin plate vibrating element to vibrate, said signals being in turn amplified by said balloon amplifier assembly.

2. An acoustic speaker system as in claim 1, wherein said pocket is a cylindrically-shaped aperture formed on the interior of said balloon amplifier surrounding said thin plate vibrating element.

3. An acoustic speaker system as in claim 1, wherein said pocket comprises an inner film laminated to an outer film, with a portion left open to form an opening into which said thin plate vibrating element is inserted.

4. An acoustic speaker system as in claim 1, wherein said balloon amplifier is formed of two balloon envelopes, each balloon envelope having an outer surface, said envelopes being arranged so as to form a single balloon amplifier, said pocket being formed between the outer surfaces of said two balloon envelopes.

* * * * *